(12) United States Patent
Lin et al.

(10) Patent No.: US 7,591,495 B2
(45) Date of Patent: Sep. 22, 2009

(54) PICK-UP HEAD DEVICE WITH A PUSHING MECHANISM

(75) Inventors: Yuan-Chi Lin, Hsin-Chu (TW); Meng-Ta Li, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 322 days.

(21) Appl. No.: 11/548,157

(22) Filed: Oct. 10, 2006

(65) Prior Publication Data

US 2008/0042459 A1 Feb. 21, 2008

(30) Foreign Application Priority Data

Aug. 18, 2006 (TW) ............... 95130416 A

(51) Int. Cl.
*B25J 15/06* (2006.01)
(52) U.S. Cl. .................................... 294/64.1
(58) Field of Classification Search ............... 294/64.1, 294/65; 414/752.1
See application file for complete search history.

(56) References Cited

U.S. PATENT DOCUMENTS

| | | | | |
|---|---|---|---|---|
| 4,600,228 A | * | 7/1986 | Tarbuck | 294/64.1 |
| 4,839,117 A | * | 6/1989 | Swenson et al. | 294/64.1 |
| 4,960,298 A | * | 10/1990 | Moroi | 294/64.1 |
| 5,324,087 A | * | 6/1994 | Shimose et al. | 294/64.1 |
| 5,755,471 A | * | 5/1998 | Bjorklund et al. | 294/64.1 |
| 5,961,169 A | * | 10/1999 | Kalenian et al. | 294/64.1 |
| 6,139,079 A | * | 10/2000 | Patel et al. | 294/64.1 |
| 2006/0055190 A1 | * | 3/2006 | Iwasaki | 294/64.1 |
| 2006/0103151 A1 | * | 5/2006 | Usui et al. | 294/64.1 |

FOREIGN PATENT DOCUMENTS

JP 406039768 * 2/1994 ............. 294/64.1

* cited by examiner

*Primary Examiner*—Paul T Chin
(74) *Attorney, Agent, or Firm*—Muncy, Geissler, Olds & Lowe, PLLC

(57) ABSTRACT

A pick-and-place head device with a pushing mechanism for handling electronic components is disclosed in this invention. The pick-and-place head device includes a fixing base connected to a robot arm and a cylinder member disposed on the fixing base, the cylinder member has a first pressure passage, one end of the first pressure passage is connected to a suction member and another end of the first pressure passage is connected to a first pressure source, and the cylinder member is connected to a second pressure source so as to push at least one pushing tip. One of the first pressure source and the second pressure source is controllably selected by a pressure controller at a given time to have a pressure operation so as to enable the suction member to pick up an electronic component or to enable the pushing tip to push the electronic component.

12 Claims, 5 Drawing Sheets

PICK-UP HEAD DEVICE WITH A PUSHING MECHANISM

CROSS REFERENCE TO RELATED APPLICATIONS

This application claims priority of Application No. 095130416 filed in Taiwan, R.O.C. on Aug. 18, 2006 under 35 U.S.C. § 119, the entire contents of all of which are hereby incorporated by reference.

BACKGROUND OF THE INVENTION

1. Field of the Invention

The present invention generally relates to a pick-and-place head device for handling electronic components, and more particularly to a pick-and-place head device with a pushing mechanism in order to avoid the failure of releasing an electronic component on a pre-determined position.

2. Description of the Prior Art

In the semiconductor device production process, the wafer test process is performed before the wafer dicing process by an automatic test equipment (ATE) to ensure the quality of electrical characteristics of the semiconductor device. After the wafers are divided into dies, a die sorter is used to pick up and place the dies on trays. The die sorter needs to handle thousands pieces of dies per hour. Especially, when the dies are small-sized and lightweight, the pick-and-place head device of the die sorter has great effects on the efficiency of the test process.

FIG. 1A and FIG. 1B show the perspective and cross-sectional views of a conventional pick-and-place head device, respectively. The conventional pick-and-place head 100 includes an air pressure joint 110, a suction member 120 and a main body member 130. The main body member 130 has an air passage 131. The air passage 131 has two openings, one opening of the air passage 131 is connected to the air pressure joint 110, and the other opening is connected to the suction member 120. The air pressure joint 110 is connected to a pressure source (not shown) having a pressure controller (not shown). When the pressure source is in negative pressure condition, the suction member 120 can pick up a die (not shown) via suction because the negative pressure is transferred to the suction member 120 through the air passage 131. And when the pressure source is in positive pressure condition, the die is then released from the suction member 120. Thus the pick-and-place head 100 can achieve the purpose of picking and placing a die by the control of the pressure source.

The pick-and-place head 100 mentioned above has only one air passage 131, and achieves the purpose of picking and placing a die by the control of a single pressure source. However, as the die has smaller size and lighter weight, when using the pick-and-place head mentioned above, the die frequently fails to be released from the suction member 120 onto the pre-determined position on a tray, because the speed of pressure control is not fast enough. This phenomenon will cause the failure of handling the die or the die will land on a wrong position. Increasing the amount of air allowed to increase the speed of pressure control may result in a risk to blow the adjacent dies placed on the tray to wrong positions or to blow the dies to flip over. When stacking the trays, the lack of precision position control may cause the damage of the dies.

For the reason that there are some disadvantages of the conventional pick-and-place head mentioned above, a need has arisen to propose a novel pick-and-place head to solve the failure of picking up and releasing a die because the speed of pressure control is not fast enough or the amount of air allowed by the pressure control is excessive. The novel pick-and-place head is also capable of improving the efficiency of picking up and releasing a die and suitable for picking up and releasing a similar electronic component which has small size and light weight.

SUMMARY OF THE INVENTION

Accordingly, the present invention has been made in order to meet such a need described above, and it is an object of the present invention to provide a pick-and-place head device with a pushing mechanism to solve the problems that the electronic component which has small size and light weight fails to be released from the suction member onto the pre-determined position on a tray, because the speed of pressure control is not fast enough.

It is another object of the present invention to provide a pick-and-place head device with a pushing mechanism having two sets of independent pressure sources to make the suction member pick up an electronic component or make the pushing tip push the electronic component to solve the problem that the electronic component is not placed on the right position or the electronic components on trays may be blown to flip over because of the excessive amount of air blowing from the pick-and-place head, thereby increasing the efficiency of the pick and place process.

In order to achieve the above objects, the present invention provides a pick-and-place head device with a pushing mechanism. The pick-and-place head device includes a fixing base connected to a robot arm and a cylinder member disposed on the fixing base, the cylinder member has a first pressure passage, one end of the first pressure passage is connected to a suction member and another end of the first pressure passage is connected to a first pressure source, and the cylinder member is connected to a second pressure source so as to push at least one pushing tip. One of the first pressure source and the second pressure source is controllably selected by a pressure controller at a given time to have a pressure operation so as to enable the suction member to pick up an electronic component or to enable the pushing tip to push the electronic component.

DETAILED DESCRIPTION OF THE INVENTION

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

Figures 1A, 1B:
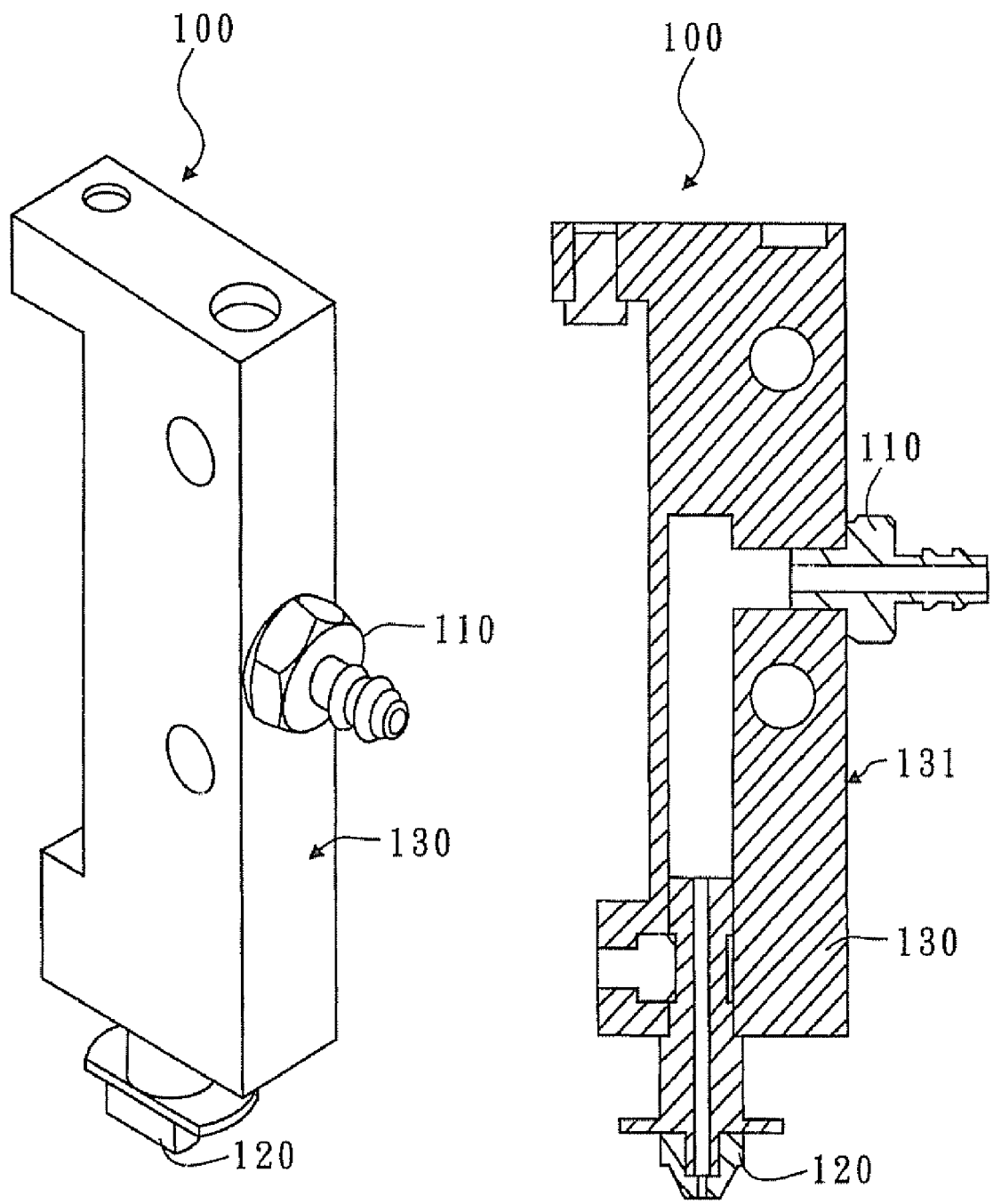
FIG. 1A and FIG. 1B show the perspective and cross-sectional views of a conventional pick-and-place head device, respectively.
Figure 2:
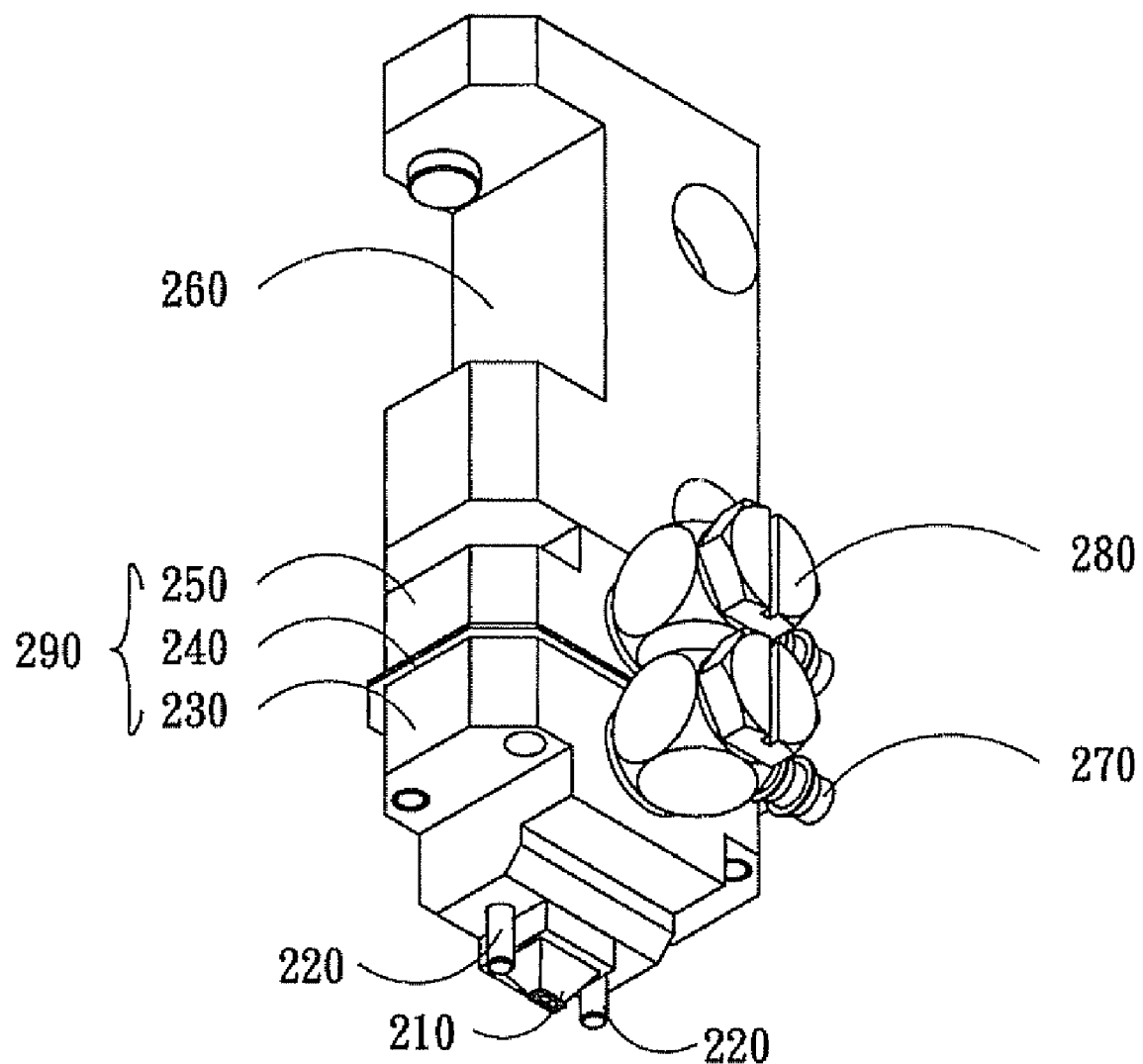
FIG. 2 shows the perspective view of a pick-and-place head device with a pushing mechanism in accordance with the first preferred embodiment of the present invention.

FIG. 2 shows the perspective view of a pick-and-place head device with a pushing mechanism in accordance with the first preferred embodiment of the present invention. The pick-and-place head device includes a fixing base 260 connected to a robot arm (not shown) and a cylinder member 290 disposed on the fixing base 260, the cylinder member 290 comprises a first cylinder member 230 and a second cylinder member 250, wherein a seal member 240 is disposed between the first cylinder member 230 and the second cylinder member 250, and the cylinder member 290 is connected to the fixing base 260 by the second cylinder member 250, a suction member 210 and at least one pushing tip 220 are disposed on the first cylinder member 230, the first pressure joint 270 is disposed on the first cylinder member 230 and the second pressure joint 280 is disposed on the second cylinder member 250.

Figure 3:
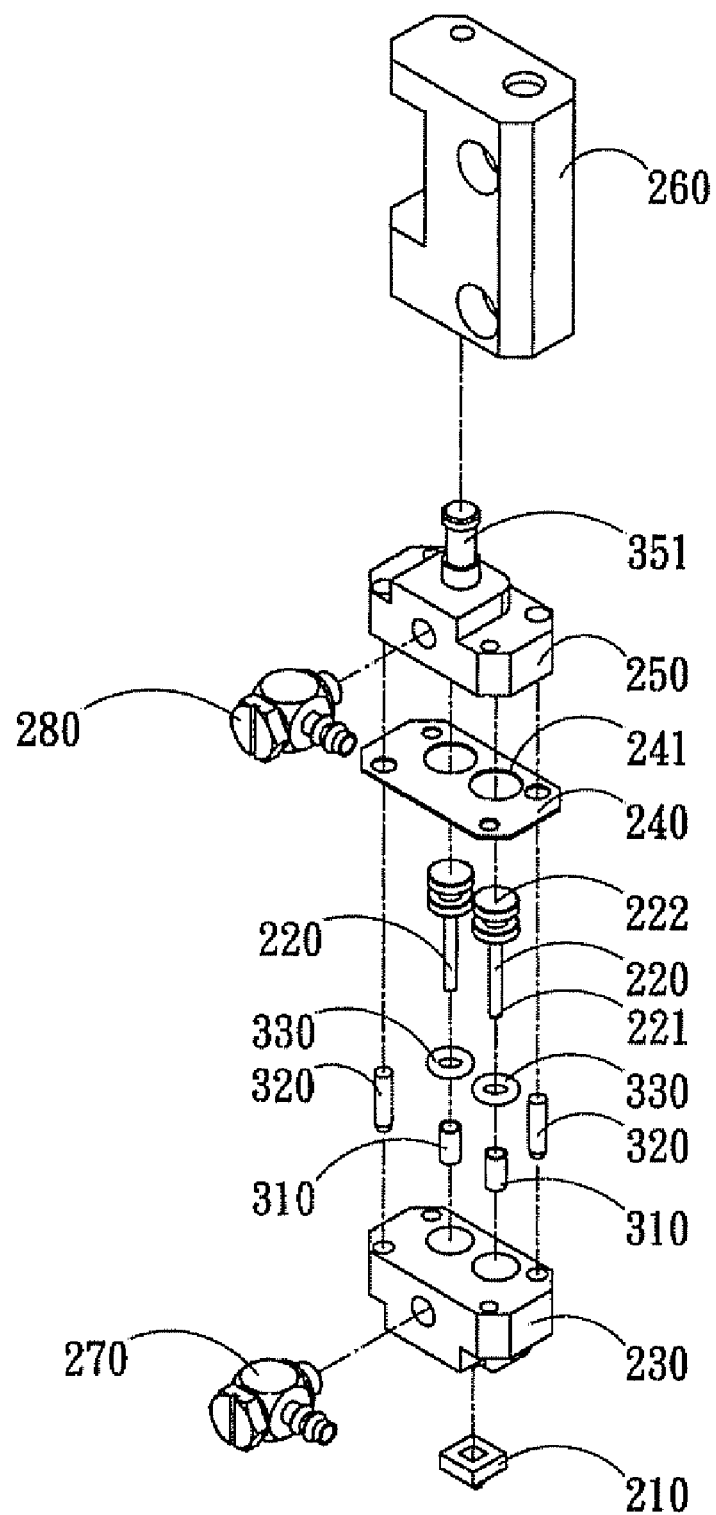
FIG. 3 shows an explosive view of a pick-and-place head device with a pushing mechanism shown in FIG. 2.

FIG. 3 shows an explosive view of a pick-and-place head device with a pushing mechanism shown in FIG. 2. The pushing tip 220 is inserted movably within the first cylinder member 230 and the pushing tip 220 comprises a pushing tip root portion 222 and a pushing tip top portion 221. At least one seal ring 330 is disposed around each pushing tip root portion 222, one end of an elastic member is connected to the pushing tip, and another end of the elastic member is connected to the cylinder member so as to push the pushing tip to an original position. For the exact assembly of the first cylinder member 230 and the second cylinder member 250, the pick-and-place head device further comprises a plurality of positioning pins 320, one end of each positioning pin 320 is inserted within the first cylinder member 230, another end of each positioning pin 320 is inserted within the second cylinder member 250.

The second cylinder member 250 has a rotating shaft 351 so as to connect the fixing base 260 by the insertion of the rotating shaft 351, the pick-and-place head device with a pushing mechanism of the present invention is able to rotate around the rotating shaft 351 so as to pick up an electronic component in a variable angle, the seal member 240 comprises at least one opening 241 on the position corresponding to the pushing tip root portion 222.

Figure 4:
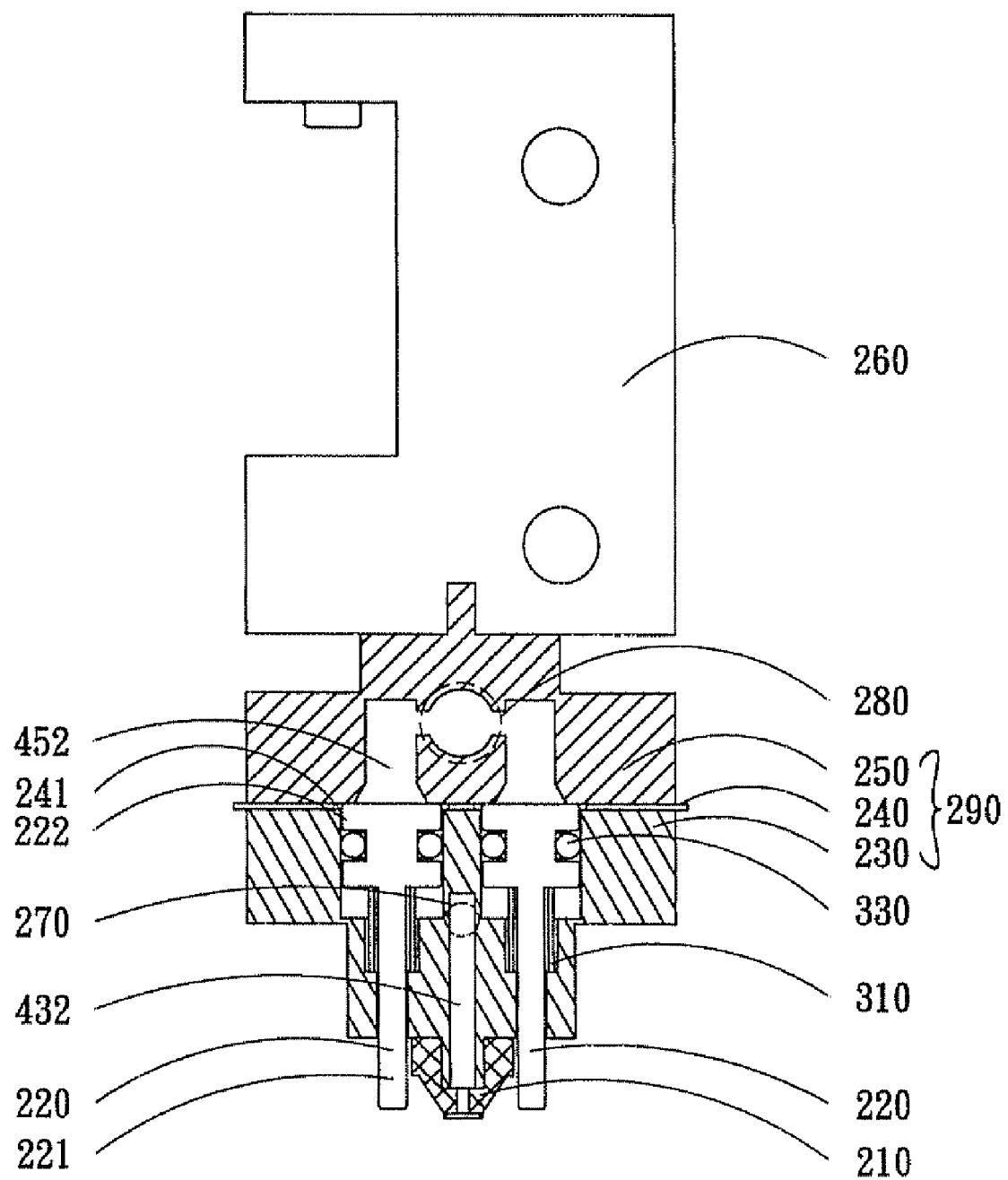
FIG. 4 shows a cross-sectional view of a pick-and-place head device with a pushing mechanism shown in FIG. 2.

FIG. 4 shows a cross-sectional view of a pick-and-place head device with a pushing mechanism shown in FIG. 2. A first pressure passage 432 is disposed within the first cylinder member 230, one end of the first pressure passage 432 is connected to the suction member 210 disposed on the first cylinder member 230, another end of the first pressure passage 432 is connected to a first pressure source (not shown) through the first pressure joint 270 disposed on the first cylinder member 230.

The second cylinder member 250 comprises a second pressure passage 452 on the position corresponding to the pushing tip root portion 222, each second pressure passage 452 is connected to a second pressure source (not shown), the pushing tip root portion 222 is pushed by the pressure operation of the second pressure source so as to make the pushing tip top 220 push outward. One of the first pressure source and the second pressure source is controllably selected by a pressure controller (not shown) at a given time to have a pressure operation so as to enable the suction member 210 to pick up an electronic component or to enable the pushing tip 220 to push the electronic component.

When the first pressure source is in a negative pressure condition, the first pressure passage 432 is controllably selected by the pressure controller to have a pressure operation, and the second pressure source is communicated with the atmosphere. The suction member 210 is capable of picking up an electronic component (a semiconductor die or a package member), and the pushing tip top 220 is not pushed outward.

When the second pressure source is in a positive pressure condition, the second pressure passage 452 is controllably selected by the pressure controller to have a pressure operation, and the first pressure source is communicated with the atmosphere. The pushing tip root portion 222 is pushed by the pressure operation of the second pressure source so as to enable the pushing tip top portion 221 to push the electronic component, the electronic component is then released from the suction member 210 on a pre-determined position. After the electronic component is released on a pre-determined position, the pushing tips 220 are pushed back to the original position by the compressed elastic member 310.

Figure 5:
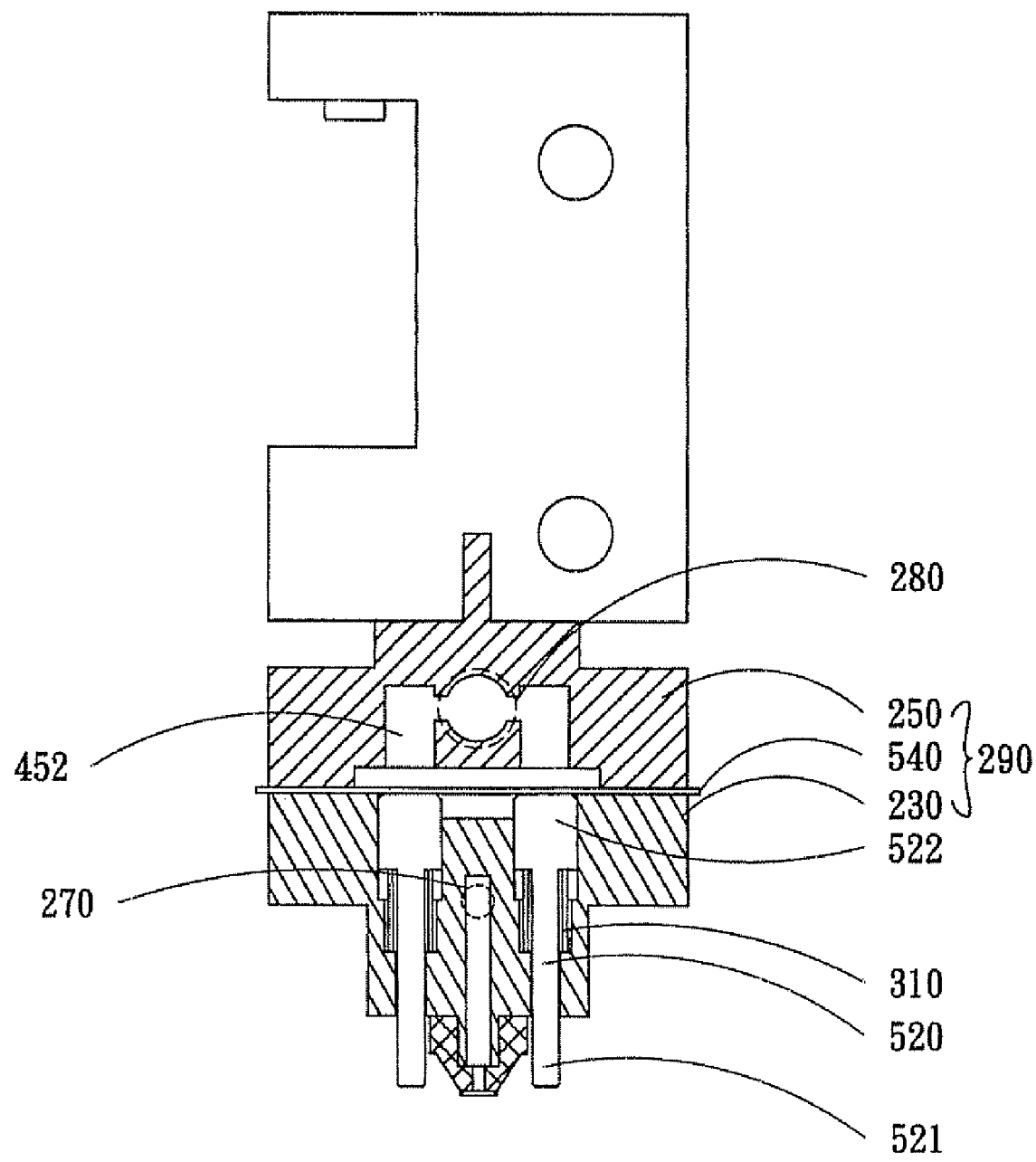
FIG. 5 shows a cross-sectional view of a pick-and-place head device with a pushing mechanism in accordance with the second preferred embodiment of the present invention.

FIG. 5 shows a cross-sectional view of a pick-and-place head device with a pushing mechanism in accordance with the second preferred embodiment of the present invention. The seal member 540 is disposed between the first cylinder member 230 and the second cylinder member 250, when the second pressure source is in a positive pressure condition, the second pressure passage 452 is controllably selected by the pressure controller to have a pressure operation, and the first pressure source is communicated with the atmosphere. The seal member 540 pushes the pushing tip root portion 522 of the pushing tip 520 so as to enable the pushing tip 520 to push the electronic component sucked on the suction member 210, the electronic component is then released from the suction member 210 on a pre-determined position on a tray.

By using the pick-and-place head device with a pushing mechanism of the present invention, it is possible to solve the problems that the electronic component which has small size and light weight fails to be released from the suction member onto the pre-determined position on a tray, because the speed of pressure control is not fast enough or the problems that the electronic component is not placed on the right position or the electronic components on trays may be blown to flip over because of the excessive amount of air blowing from the pick-and-place head, thereby increasing the efficiency of the pick and place process.

Although specific embodiments have been illustrated and described, it will be appreciated by those skilled in the art that various modifications may be made without departing from the scope of the present invention, which is intended to be limited solely by the appended claims. For example, the pushing tip 220 mentioned above can be replaced by another pushing mechanisms (pusher or presser), the shape of the pushing mechanism is not limited to a pin shape or a column shape, an annular shape is also able to achieve the objects of the present invention. The suction member 210 is not limited to the embodiments of the present invention, the suction member 210 is also able to be replaced by another holder mechanism (holder or collect holder). The elastic member 310 to push the pushing tip 220 back to the original position is not necessary to use a spring, another restoring mechanism, for example, a plate spring is capable of achieving the objects of the present invention.

What is claimed is:

1. A pick-and-place head device, comprising:
   a fixing base;
   a main body, said main body disposed on said fixing base, wherein said main body has a first pressure passage, one end of said first pressure passage is connected to a suction member and another end of said first pressure passage is connected to a first pressure source; and
   at least two pushing tips, said pushing tips disposed on said main body, wherein said suction member is disposed between said pushing tips, and said main body is connected to a second pressure source;

wherein said first pressure source is capable of providing a negative pressure, said second pressure source is capable of providing a positive pressure, one of said first pressure source and said second pressure source is controllably selected by a pressure controller at a given time to have a pressure operation so as to enable said suction member to pick up an electronic component or to enable said pushing tips to push the electronic component.

2. The pick-and-place head device according to claim 1, wherein said main body comprises a first cylinder member and a second cylinder member, and said first pressure passage is disposed inside said first cylinder member, wherein one end of said first pressure passage is connected to said suction member disposed on said first cylinder member, and another end of said first pressure passage is connected to said first pressure source through a first pressure joint disposed on said first cylinder member.

3. The pick-and-place head device according to claim 2, wherein said second cylinder member has a shaft so as to connect said fixing base by the insertion of said shaft within said fixing base.

4. The pick-and-place head device according to claim 2, further comprising a plurality of positioning pins, wherein one end of each said positioning pin is inserted within said first cylinder member and another end of each said positioning pin is inserted within said second cylinder member.

5. The pick-and-place head device according to claim 2, wherein said pushing tips are inserted movably within said first cylinder member and each said pushing tip comprises a pushing tip root portion and a pushing tip top portion.

6. The pick-and-place head device according to claim 5, further comprising an elastic member, wherein one end of said elastic member is connected to said pushing tip, and another end of said elastic member is connected to said cylinder member so as to push said pushing tip to an original position.

7. The pick-and-place head device according to claim 5, wherein said second cylinder member comprises a second pressure passage disposed on a position corresponding to said pushing tip root portion, wherein each said second pressure passage is connected to said second pressure source, said pushing tip root portion is pushed by said positive pressure of said second pressure source so as to enable said pushing tip top portion to push the electronic component.

8. The pick-and-place head device according to claim 7, further comprising a seal member disposed between said first cylinder member and said second cylinder member, wherein said seal member comprises at least one opening on a position corresponding to said pushing tip root portion.

9. The pick-and-place head device according to claim 8, further comprising at least one seal ring disposed around each said pushing tip root portion.

10. The pick-and-place head device according to claim 7, wherein said second pressure source is communicated with the atmosphere when said first pressure passage is controllably selected by said pressure controller.

11. The pick-and-place head device according to claim 7, wherein said first pressure source is communicated with the atmosphere when said second pressure passage is controllably selected by said pressure controller.

12. The pick-and-place head device according to claim 7, further comprising a seal member disposed between said first cylinder member and said second cylinder member, wherein said seal member pushes said pushing tip root portion by said positive pressure of said second pressure source.

* * * * *